(12) United States Patent
Cheng et al.

(10) Patent No.: US 6,935,130 B2
(45) Date of Patent: Aug. 30, 2005

(54) COMPUTER COOLING SYSTEM

(75) Inventors: Yu-Chih Cheng, Taipei Hsien (TW);
Lin Zheng, Hsi-Chih (TW);
Wei-Chuan Ho, Hsi-Chih (TW);
Jin-Wang Yao, Hsi-Chih (TW);
Ting-Yu Chang, Hsi-Chih (TW)

(73) Assignee: Aopen Inc., Hsi-Chih (TW)

( * ) Notice: Subject to any disclaimer, the term of this patent is extended or adjusted under 35 U.S.C. 154(b) by 0 days.

(21) Appl. No.: 10/601,783

(22) Filed: Jun. 24, 2003

(65) Prior Publication Data

US 2004/0264125 A1 Dec. 30, 2004

(51) Int. Cl.[7] .............................. F25D 23/12; F24F 7/00; H05K 7/20
(52) U.S. Cl. ............... 62/259.2; 236/49.3; 236/DIG. 9; 361/687; 361/695
(58) Field of Search ....................... 62/259.2; 236/49.3, 236/DIG. 9; 361/694, 695, 687, 688; 165/80.3; 454/184

(56) References Cited

U.S. PATENT DOCUMENTS

| | | | | |
|---|---|---|---|---|
| 4,722,669 A | * | 2/1988 | Kundert | 417/32 |
| 5,249,741 A | * | 10/1993 | Bistline et al. | 236/49.3 |
| 5,526,289 A | * | 6/1996 | Dinh et al. | 700/300 |
| 5,543,632 A | * | 8/1996 | Ashley | 257/48 |
| 6,011,371 A | * | 1/2000 | Van Brocklin et al. | 318/471 |
| 6,134,667 A | * | 10/2000 | Suzuki et al. | 713/300 |
| 6,172,611 B1 | * | 1/2001 | Hussain et al. | 340/584 |
| 6,348,873 B1 | * | 2/2002 | Wang et al. | 340/635 |
| 6,597,972 B2 | * | 7/2003 | Emberty et al. | 700/304 |
| 6,643,128 B2 | * | 11/2003 | Chu et al. | 361/687 |
| 6,654,894 B2 | * | 11/2003 | Kaminski et al. | 713/300 |
| 2002/0020755 A1 | * | 2/2002 | Matsushita | 236/49.3 |
| 2003/0063437 A1 | * | 4/2003 | Kurihara | 361/688 |

OTHER PUBLICATIONS

"Fan–Speed Control Techniques in PCs".
An 120 Fan For Personal Computers.

* cited by examiner

Primary Examiner—Marc Norman
(74) Attorney, Agent, or Firm—Winston Hsu

(57) ABSTRACT

A cooling system includes a cooling fan, a fan input-output module for transmitting a control signal to the fan for controlling the rotational speed of the fan, and a chipset interface for generating the fan control signal based on a change in a vital temperature of the computer system. Further provided is a controller for receiving the vital temperature and forwarding the vital temperature to the chipset interface, and a temperature transducer for generating the vital temperature and outputting the vital temperature to the controller. The chipset interface monitors a rotational speed of the cooling fan, and monitors a vital temperature of the computer system. The chipset interface then sets the fan power based on a change in the vital temperature. When the vital temperature decreases, the fan power is reduced to slow the fan, and when the vital temperature increases, the fan power is increased to speed the fan.

22 Claims, 6 Drawing Sheets

COMPUTER COOLING SYSTEM

BACKGROUND OF INVENTION

1. Field of the Invention

The present invention relates to a cooling system for a computer, and more specifically, to a fan speed controlling cooling system for a personal computer.

2. Description of the Prior Art

As computer processing speeds steadily increase, the need for high capacity cooling systems becomes essential. Proper cooling prevents heat related failure of the processor when under operating loads. Typical cooling systems have progressed beyond the venerable constantly running fan to include temperature sensors and related control circuits for dynamically adjusting fan speed. While several fan speed control schemes have been developed, nearly all focus entirely on maximizing cooling effects or reducing power consumption. One aspect of fan control has been continuously neglected in development of control schemes and related circuitry, that is, fan noise level.

In the article Hanrahan, D. "Fan-Speed Control Techniques in PCs" *Analog Dialogue* Vol.34, No.4 (June–July 2000), which is incorporated herein by reference, several fan speed control schemes and circuits are described in detail. The first is a two-step fan control method in which a thermistor installed near a CPU or an on-die thermal monitoring transistor outputs a system temperature to a BIOS. The BIOS then switches a cooling fan on or off depending on the system temperature, a marked improvement over a constantly running fan. Similar to the two-step method, a three-step fan control method adds an additional half-speed setting for the fan. The half-speed setting is enabled when the processor is engaged in light duty generating little heat. The third method, a linear fan-speed control method, includes digital logic components that enable a range fan speeds based on the measured system temperature. The linear method is quite simply an extension of the three-speed method. Finally, a similar pulsewidth-modulation fan-speed control method allows fan speed to be controlled by adjusting fan signal duty cycle. While these are just a sampling of conventional fan speed control methods, they are representative of the current technology.

To realize linear fan-speed control methods such as that described above, circuits having the required operational logic have been developed. FIG. 1 illustrates a general state-of-the-art computer fan speed control circuit 10. The circuit 10 includes a fan 12 connected to a chipset controller 14 through a fan input-output interface 16. Generally, the chipset controller 14 contains logic linearly relating fan speeds to measured temperatures, and generates and outputs a corresponding control signal. Based on a temperature measured at a sensor 18, the chipset controller 14 outputs the control signal to the fan I/O 16, which controls the rotational speed of the fan 12. In an example of a specific conventional implementation, subcomponents of the blocks of the circuit 10 are as disclosed in Steele, J. "An I²C Fan for Personal Computers" *Electronic Design* Aug. 3, 1998, which is incorporated herein by reference. In an example of a linear fan-speed control method, the chipset controller 14 is programmed with a series of trigger temperatures and a corresponding series of signals having encoded fan speeds, which are directly proportional to the series of trigger temperatures. Thus, the controller 14 outputs a fan control signal identifying a fan speed corresponding to the temperature trigger reached.

The prior art methods of controlling a fan to cool a processor cannot suitably meet current cooling requirements. Having been developed for performance and power savings, these methods typically suffer in other areas of concern. Specifically, noise levels can be uncomfortably high in conventional fan cooling applications.

SUMMARY OF INVENTION

It is therefore a primary objective of the claimed invention to provide a cooling system for a computer that minimizes fan noise level while improving cooling performance and power conservation.

Briefly summarized, the claimed invention method monitors a rotational speed of at least a cooling fan of the computer system, the rotational speed of the cooling fan being controlled by a fan power, and further, monitors a vital temperature of the computer system. The method then sets the fan power based on a change in the vital temperature. When the vital temperature decreases, the fan power is reduced to slow the fan rotational speed, and when the vital temperature increases, the fan power is increased to increase the fan rotational speed.

According to the claimed invention, the method can further increase the fan power by a first power when the vital temperature increases by a first temperature, and decrease the fan power by a second power when the vital temperature decreases by a second temperature. The first power is directly proportional to the first temperature, and the second power is directly proportional to the second temperature.

According to the claimed invention, the cooling fans controlled include a CPU cooling fan, an auxiliary cooling fan, or a power supply cooling fan, and the vital temperature is obtained from an on-die thermal monitoring transistor of the CPU.

A cooling system device according to the claimed invention includes at least a cooling fan, a fan input-output module for transmitting a control signal to the fan for controlling the rotational speed of the fan, and a chipset interface for generating the fan control signal based on a change in a vital temperature of the computer system and outputting the fan control signal to the fan input-output module. The cooling system device further includes a controller for receiving the vital temperature and forwarding the vital temperature to the chipset interface, and a temperature transducer for generating the vital temperature and outputting the vital temperature to the controller.

It is an advantage of the claimed invention that the differential consideration of temperature, that is, the measurement of the change in vital temperature, improves the control of the fan speed.

It is a further advantage of the claimed invention that the differential consideration of temperature and the corresponding differential setting of the fan speed result in reduction in fan speed, and thus, fan noise and power consumption.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
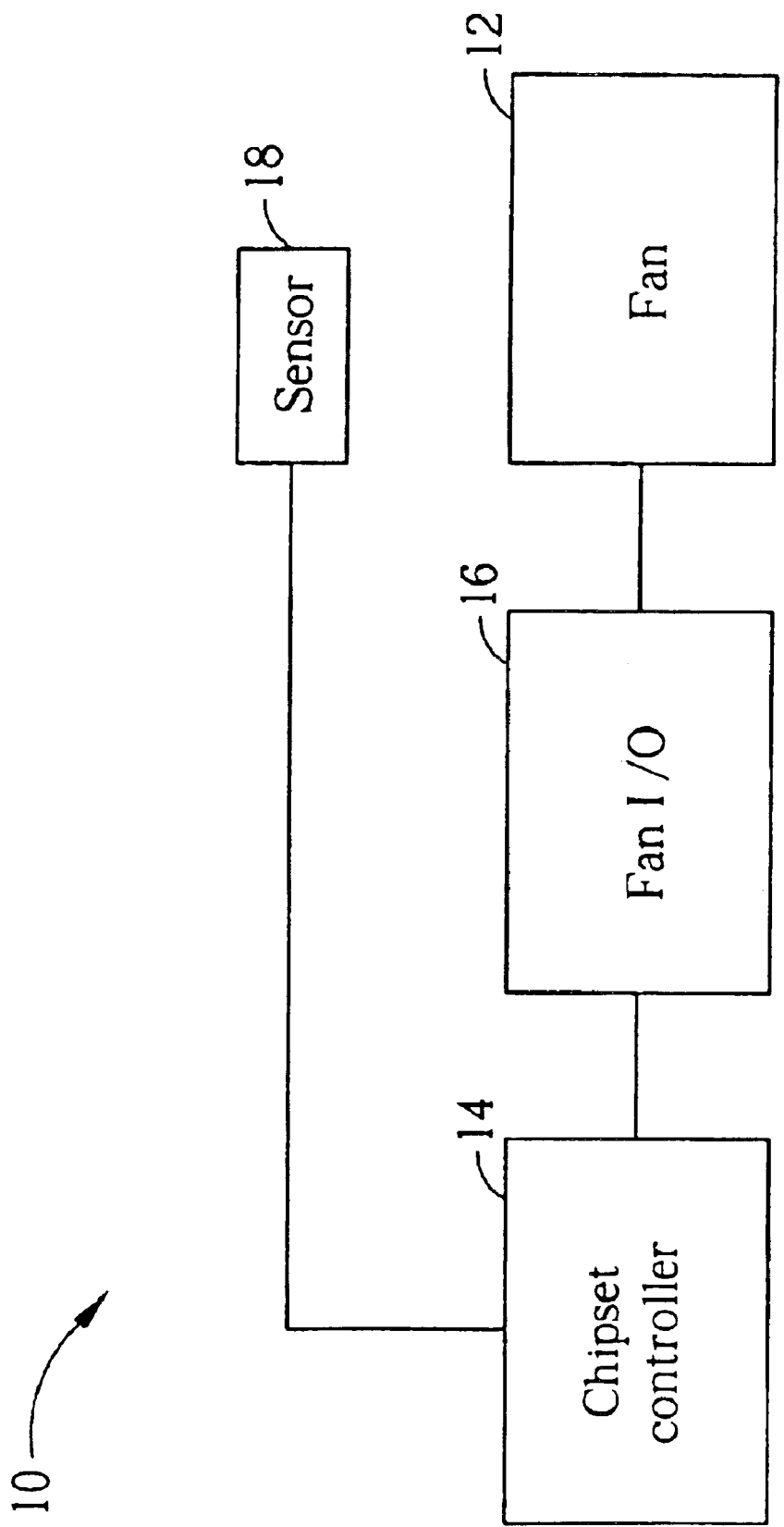
FIG. 1 is a schematic diagram of a computer cooling system according to the prior art.
Figure 2:
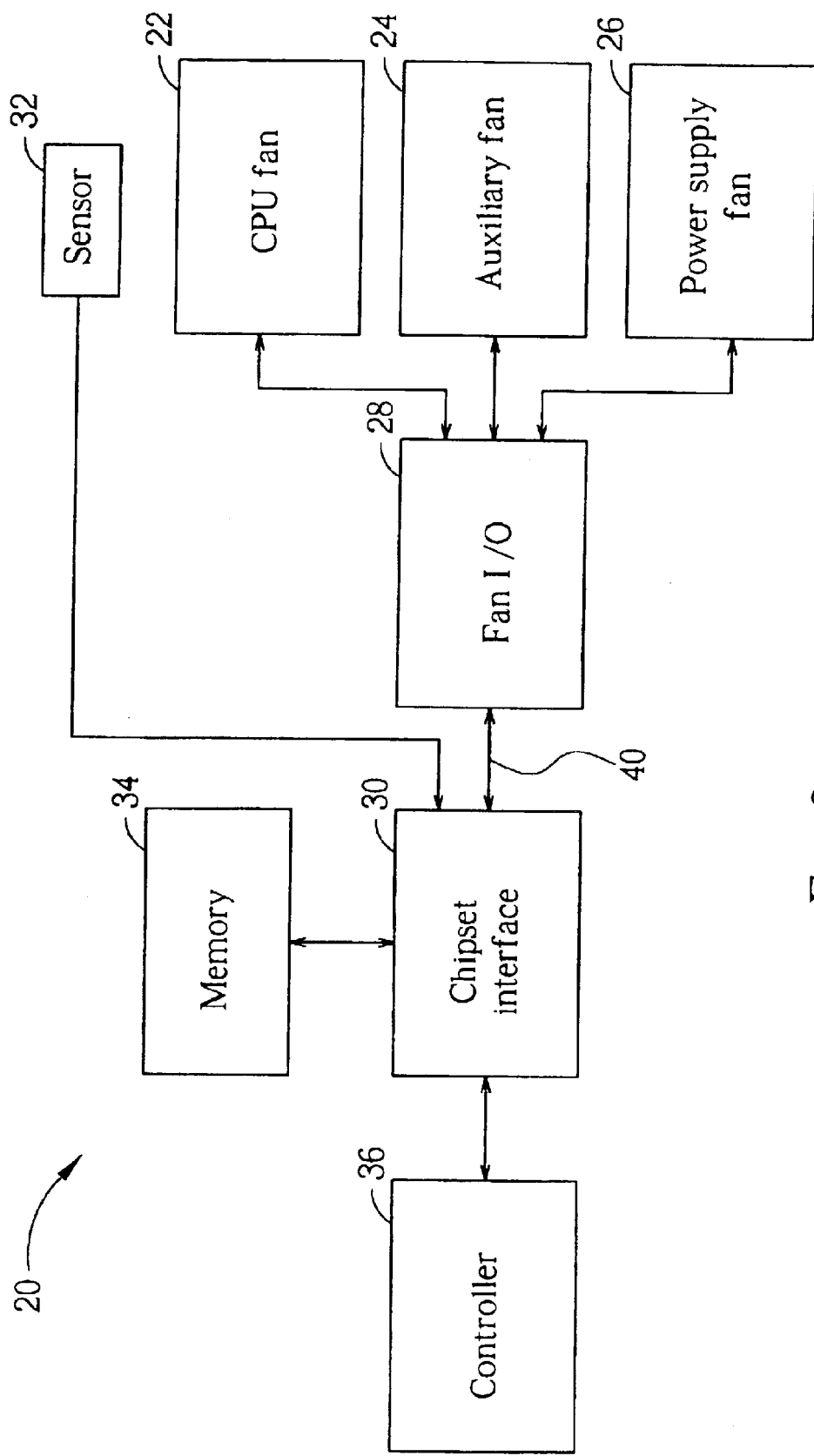
FIG. 2 is a schematic diagram of a computer cooling system according to the present invention.

Please refer to FIG. 2 showing architecture of a cooling system 20 for a computer according to the present invention. The cooling system 20 includes a series of fans, of which all are optional as long as one is provided, including a CPU fan 22, an auxiliary (case) fan 24, and a power supply fan 26 installed in the computer. The fans 22, 24, 26 are three pin fans, the pins being power and ground pins for operation, and a tachometer output pin for rotational speed measurement. The CPU fan 22 is attached to a CPU heat sink, the auxiliary fan 24 is typically mounted inside the computer case near vent holes, and the power supply fan 26 is provided in the AC to DC power supply enclosure. The cooling system 20 can be applied in a wide variety of computer designs each having different fan arrangements. It is anticipated that many such implementations will include only the CPU fan 22, which is the most common active cooling device for modern processors. The cooling system further includes a fan input-output module 28 adapted to the number and types of fans used. The fan I/O 28 outputs analog control signals to the fans 22, 24, 26 based on digital control signals 40 received from a chipset interface 30. As most currently available fans require analog input, the fan I/O 28 facilitates the analog/digital conversion between the fans 22, 24, 26 and the chipset interface 30. The chipset interface 30 is connected to a temperature sensor 32, such as an on-die temperature sensitive transistor or a strategically placed thermistor, thermopile, or the like, to measure a vital temperature of the computer system. The sensor 32 can be located anywhere practical within the computer system, but an on-die transistor yields the most accurate results, and is standard on modern CPUs. The chipset interface 30 decodes and stores the temperature signal output by the sensor 32, and generates and outputs resulting control fan signals 40 to the fan I/O 28. To aid operation of the chipset interface 30 a memory 34 is provided to store relations of temperature to fan speed and other relevant data. Finally, the cooling system 20 includes a controller 36, such as a BIOS or an operating system (such as Microsoft Windows™ or Linux™), for controlling the chipset interface 30 and managing the overall operation of the cooling system 20. Aside from the auxiliary fan 24 and power supply fan 26, the hardware components of the cooling system 20 are typically provided on the computer motherboard.

In the preferred embodiment, the chipset interface 30 is software code executed by the processor of the computer system. That is, the chipset interface 30 comprises a set of instructions for the CPU to execute. In other embodiments, the chipset interface could include hardware instructions in a ROM, flash memory, or similar device. In practical applications, whether the chipset interface 30 is realized by software or hardware is determined by a skilled designer.

According to the preferred embodiment, the memory 34 stores the relationships between the vital temperature and fan speed for each of the fans 22, 24, 26. These relationships can be stored in tabular form or as computational algorithms in the memory 34. The chipset interface 30 then references a selected tabulated data or algorithm for the selected fan and generates the fan control signal 40 accordingly. In addition, the memory 34 is used by the chipset interface 30 for temporary storage of data required by processing operations. In practical application, the memory 34 is a hard disk, RAM, or BIOS memory of the computer system.

Operations of the fan I/O 28, the fans 22, 24, 26, and the sensor 32 are well known in the art, and one of ordinary skill in the art would be able to find ample references, in addition to those mentioned here, relating specific circuits and procedures for specific component selections. Thus, a variety temperature sensors and fans can be used, and the present invention is not limited by such design choices.

As described above, the chipset interface 30 generates the fan control signal 40. Depending on the number and type of fans used, the fan control signal 40 can have several encoded components. For example, if the CPU fan 22 and the auxiliary fan 24 are used, the fan control signal 40 comprises a CPU fan control segment and an auxiliary fan control segment, separated by time division, digital encoding, or a similar encoding scheme.

Figure 3:
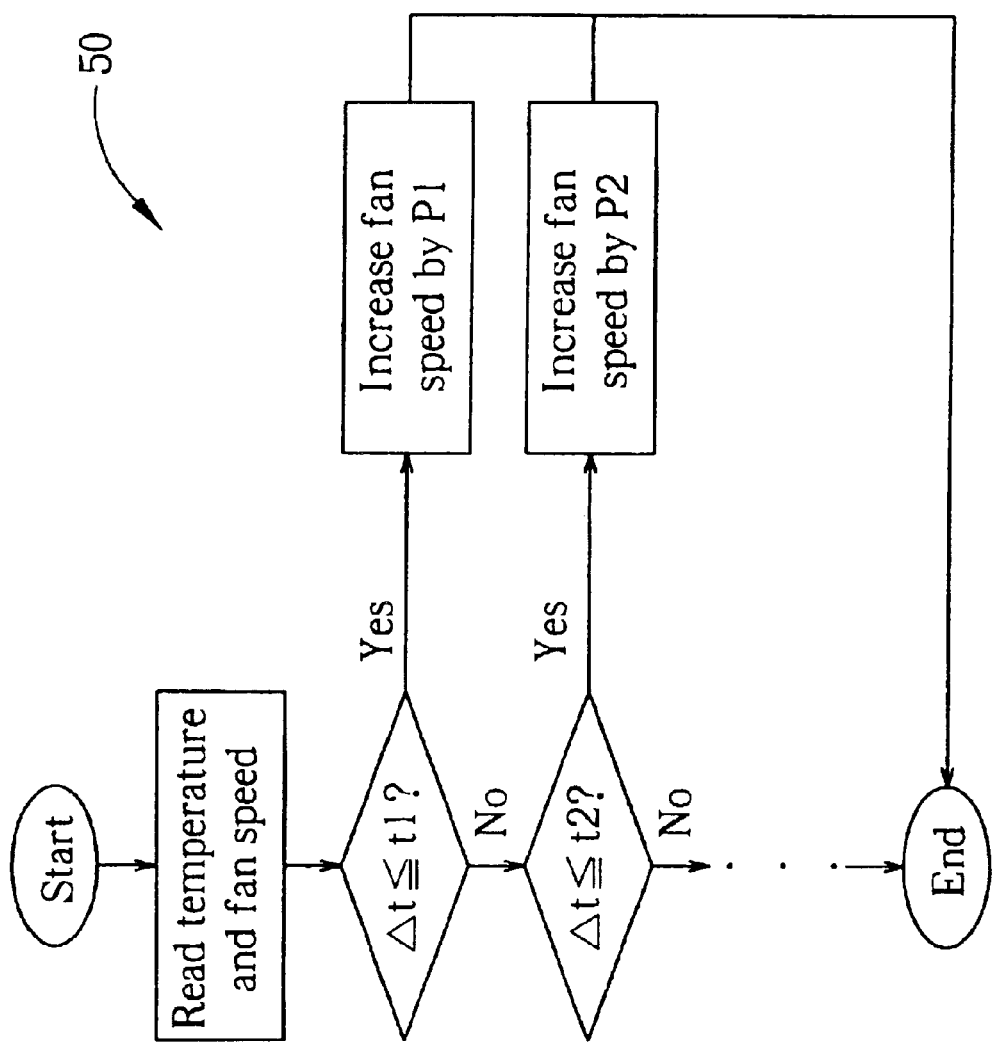
FIG. 3 is a flowchart of a first method according to the present invention.

The chipset interface 30 determines and sets the fan speeds according to changes of the output of the temperature sensor 32. Before setting fan speeds, the chipset interface 30 measures the maximum RPM of each connected fan 22, 24, 26. This allows the chipset interface 30 to prevent over or under powering the fan, and to perform calculations and produce output as percentages of maximum fan speed. FIG. 3 illustrates a flowchart of a first method 50 performed by the chipset interface 30 according to the present invention. First, the sensor 32 outputs the measured temperature to the interface chipset 30. The tachometer of a fan 22, 24, 26 outputs a fan speed measurement to the interface chipset 30, so that when the chipset interface 30 modifies the fan speed it can ensure that the fan is not overpowered or stalled. Then, the chipset interface 30 calculates a level of a change in temperature, Δt, of the sensor 32 and compares the change with thresholds t1, t2, etc. Finally, the chipset interface 30 selects a corresponding change in fan speed, P1, P2, etc, and effects this change in fan speed by outputting a corresponding fan signal 40. The values and quantities of the change in temperature thresholds t1, t2, etc and the corresponding change in fan speeds P1, P2, etc can be selected referencing sound design principles. This procedure can be performed for all fans in the system, either sequentially or simultaneously. As a result, a measured change in vital temperature of the CPU or preferred measuring point is converted into a change in fan speed of a desired fan.

Figure 4:
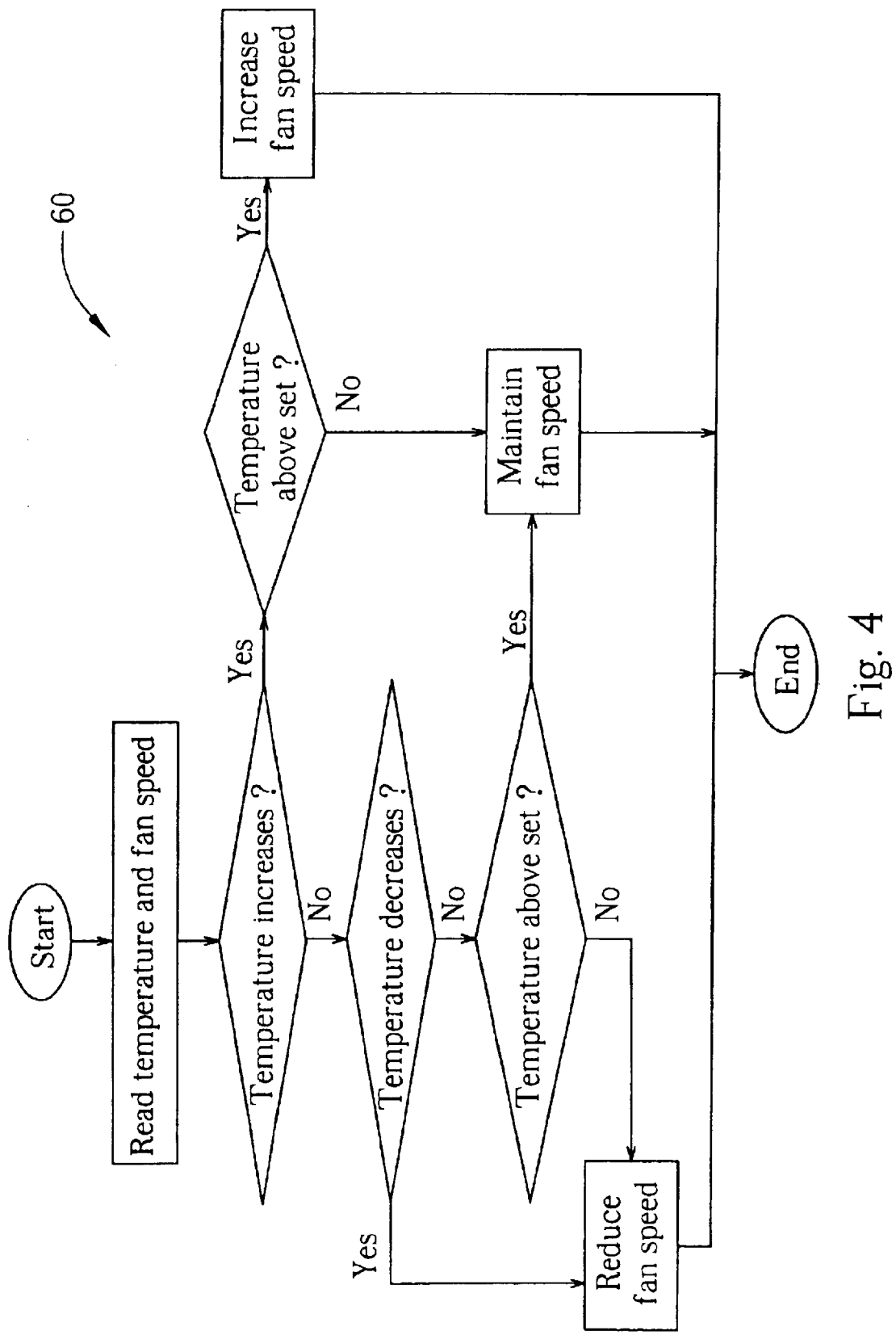
FIG. 4 is a flowchart of a second method according to the present invention.

FIG. 4 shows a flowchart of a second method 60 according to the present invention. As in the first method 50, the sensor 32 and the tachometer of a fan 22, 24, 26 respectively output a temperature and a fan speed measurement to the chipset interface 30. Then, the chipset interface 30 determines if the vital temperature of the computer system has increased, decreased, or remained unchanged. The second method 60 further introduces a set temperature threshold for enhanced control, the set temperature being set based on design parameters of the computer system, such as heat sink quality, fan cooling effect, and normal processor activity. When the temperature increases, the chipset interface 30 compares the temperature level to the set temperature, increasing the fan speed when the temperature is above the set temperature and otherwise maintaining the fan speed. When the temperature decreases, the chipset interface 30 reduces the fan speed. When there is no significant change in the vital temperature, the chipset interface 30 maintains the fan speed if the temperature is above the set temperature and reduces the fan speed when the temperature is below the set temperature. The threshold determining a temperature change and the levels of fan speed change effected are selected based on the specific computer system design. Naturally, the above procedure shown in FIG. 4 can be performed sequentially or simultaneously for all fans in the system.

A sample of pseudo-code that realizes the second method 60 shown in FIG. 4 is given below:

```
Ti = current CPU temperature
Ti-1 = previous CPU temperature
Tset = set temperature
PWM = fan speed as percentage of full speed
If Ti > Ti-1 and Ti >= Tset then
   PWM = PWM + 30%
   (limit PWM to 100%)
ElseIf Ti > Ti-1 and Ti < Tset then
   PWM = PWM
ElseIf Ti < Ti-1 then
   PWM = PWM - 20%
   (limit PWM to 0%, or above stall speed)
ElseIf Ti = Ti-1
   If Ti > Tset then
      PWM = PWM
   Else
      PWM = PWM - 20%
      (limit PWM to 0%, or above stall speed)
   EndIf
EndIf
```

To complement the second method 60 described above, catch-all fan speed levels are established to insure that at certain temperature levels relative to the set temperature, certain minimum fan speeds are maintained. These fan speed levels serve as insurance against the unpredictability of processor loading and consequent heat generation. A sample of pseudo-code for this is given below:
Tc=a critical operating temperature if the computer system
If Ti−Tset>0 and PWM<10% then PWM=10%
If Ti−Tset>3 and PWM<50% then PWM=50%
If Ti−Tset>6 and PWM<100% then PWM=100%
If Ti>=Tc then PWM=100%

For example, from the above, when the measured vital temperature is above the set temperature by 3 degrees, the fan speed is automatically set to half of full speed. In addition, if the temperature goes above the critical temperature, which is typically indicated by CPU manufacturers as a maximum operating temperature of the CPU before any CPU fail-safes initiate, the fan is automatically run at full speed. The incorporation of set fan speeds for set temperature ranges acts to supplement the differential fan speed control of the second method 60 of the present invention.

When computer system is being booted, is in the power-on self-test (POST) state, or is otherwise not under control of a conventional operating system, the present invention is performed by the BIOS. That is, the chipset interface 30 is realized with BIOS code executable by a BIOS processor under control of the controller (BIOS) 36, and the memory 34 is a BIOS memory accessible by the BIOS processor. It should be noted that even though the computer is booting or in the POST state, it can execute specially developed applications and therefore can generate significant amounts of heat. In this way, thermal management can be accomplished independent of operating system.

When the computer system is under control of an operating system, the present invention is performed by code executable under the operating system. The chipset interface 30 is realized with operating system executable code, such as code written and complied according to the C programming language. The memory 34 is a RAM or hard disk of the computer system, accessible by the operating system. Any application incorporating the present invention in both the operating system environment and the BIOS thus has two independent instruction sets and two separate memory elements. While this duality has advantages, such as redundancy and robustness, harmonization of the chipset interface code 30 and physical memory 34 is also possible. As such, thermal management can be accomplished under the operating system and under both the operating system and the BIOS of the computer.

Aside from one or both of the present invention temperature control methods 50, 60 described previously, the chipset interface 30 can also be programmed with well-known methods. The chipset interface 30 is then capable of switching between such well-known methods and the methods 50, 60 according to the present invention. Examples of such well-known methods include the fixed fan speed control and multiple level fan speed control methods, with detailed descriptions being given in the description of the prior art. A suitable user interface or automatic control system is provided to the chipset interface 30 to realize switching between several temperature control schemes.

As mentioned, the chipset interface 30 controls the speed of the power supply fan 26 according the temperature measured by the senor 32. This reduces power consumption and fan noise by reducing an unnecessarily high speed of the power supply fan 26. When used to control the power supply fan 26, the method 50, 60 is set to consider heat generated by the power supply in addition to heat generated by the CPU. This is realized by precisely setting parameters, such as thresholds t1, t2 and fan speed increments P1, P2. That is, automatic shutdown of the power supply due to overheating as a result of low fan speed, initiated by a temperature sensitive switch or similar device, is prevented.

Figure 5:
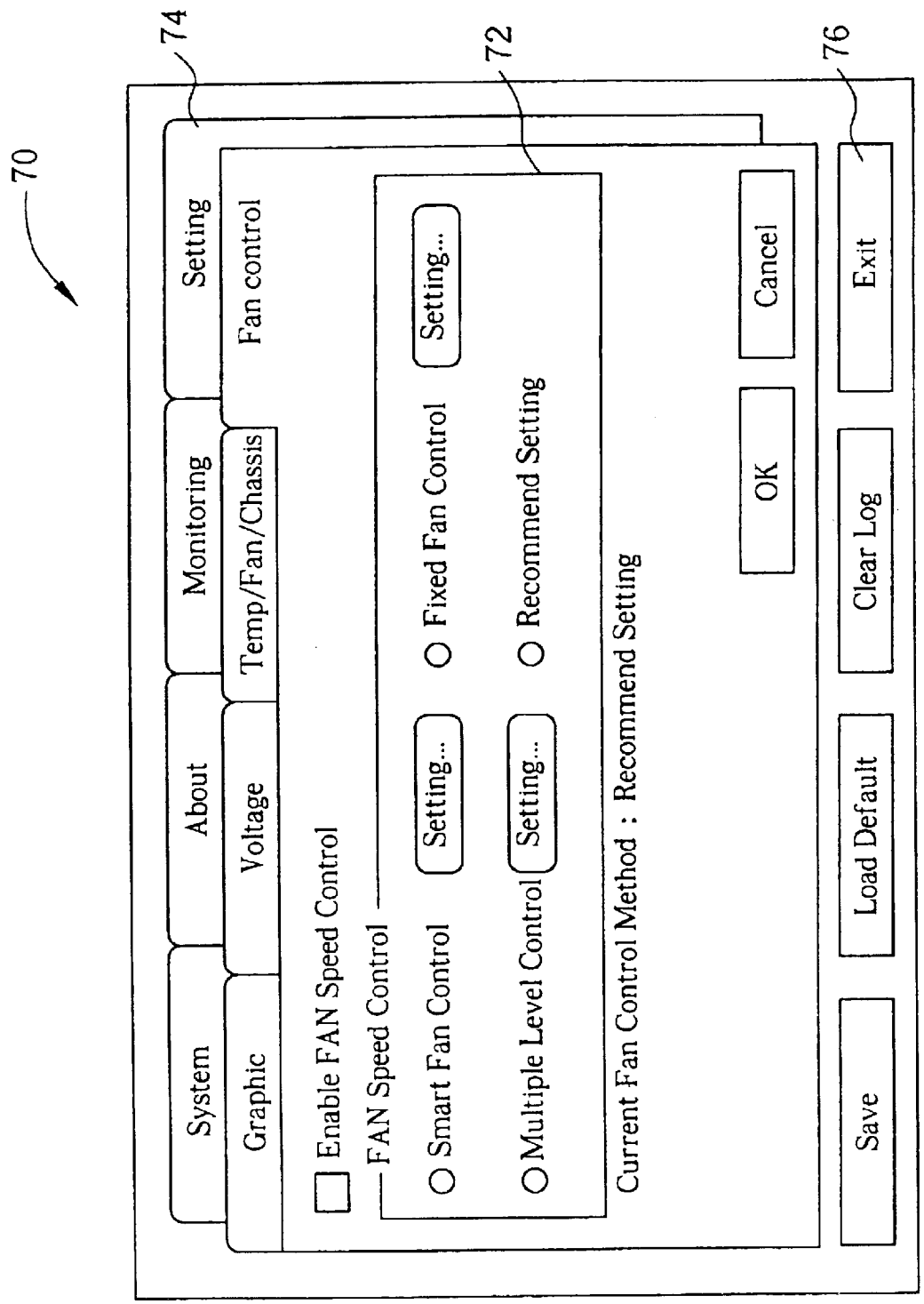
FIG. 5 is a diagram of a user interface according to the present invention.
Figure 6:
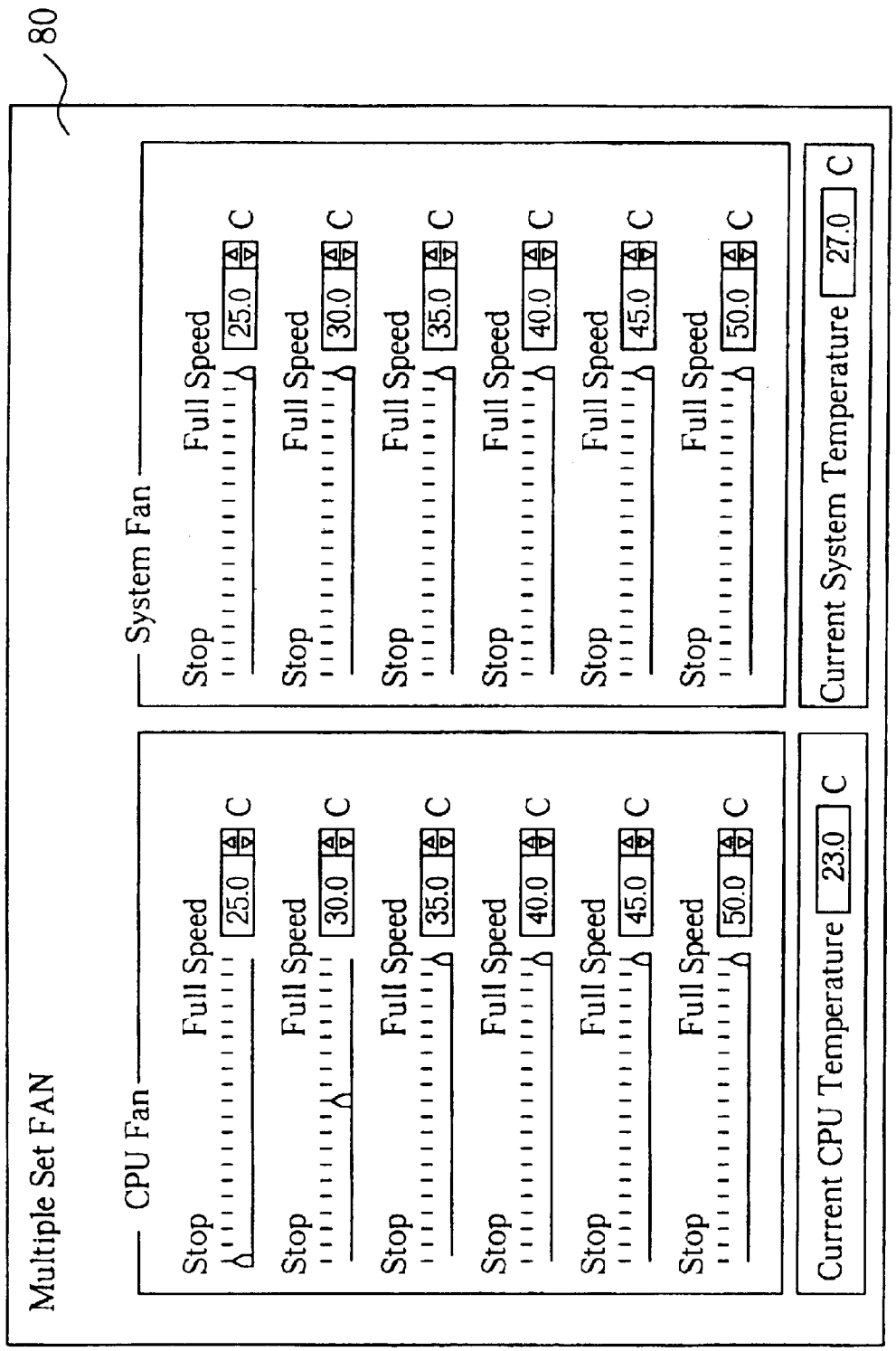
FIG. 6 is a diagram of a fan speed setting interface of the user interface of FIG. 5.

According to the present invention, the chipset interface 30 can be provided with a user interface to allow for user configuration of temperature control. Of interest to a user is selecting the specific temperature control method, configuring parameters influencing the selected method, and monitoring temperature and fan speed output. FIG. 5 illustrates such a user interface 70 according to the present invention. The user interface 70 is realized with a window in the operating system of the computer, and a similar user interface can be provided in the BIOS. An option to select between four modes of fan speed control is provided in the region 72. Further, panels 74 allow the user to access and configure different aspects of fan control, such as voltage settings and graphical output, and control buttons 76 provide a means of control, such as saving and exiting commands. When the user desires to configure fan speed control, they are presented with a window such as a fan speed setting interface 80 of FIG. 6. The fan speed setting interface 80 comprises several slider bars for setting fan speed corresponding to configurable temperatures levels for each fan included in the cooling system, realizing a configurable multilevel fan speed control system. Control of other cooling algorithms can be provided by similar windows. With user interfaces 70 and 80 and other similar interfaces, a user can finely tune the present invention cooling system according to his or her specific needs.

In contrast to the prior art, the present invention provides a cooling system and methods for operation thereof that minimize fan noise while reducing power and maintaining allowable operating temperatures. Specifically, the present invention provides methods that relate changes in computer system vital temperature to changes in fan speed of one or more cooling fans, including a power supply cooling fan. A chipset interface is provided to measure the changes in vital temperature, calculate the corresponding fan speeds, and output a control signal to achieve these fan speeds. Thus, the preset invention realizes improvements in power consumption and fan noise.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for controlling an operating temperature of a computer system, the method comprising:

monitoring a rotational speed of at least a cooling fan of the computer system, the rotational speed of the cooling fan being controlled by a fan power;

monitoring a vital temperature of the computer system;

calculating a change in the vital temperature; and setting the fan power based on tile calculated change in the vital temperature;

wherein when the change in the vital temperature is negative, the fan power is reduced to reduce the fan rotational speed; and when the change in the vital temperature is positive, the fan power is increased to increase the fan rotational speed;

wherein setting the fan power further comprises:

maintaining the fan power when the vital temperature increases and the vital temperature is below a set temperature;

maintaining the fan power when the vital temperature remains constant and the vital temperature is above the set temperature; and decreasing the fan power by a third power when the vital temperature remains constant and the vital temperature is below the set temperature.

2. The method of claim 1 wherein setting the fan power further comprises:

increasing the fan power by a first power when the vital temperature increases by a first temperature, the first power being directly proportional to the first temperature.

3. The method of claim 1 wherein setting the fan power further comprises:

decreasing the fan power by a second power when the vital temperature decreases by a second temperature, the second power being directly proportional to the second temperature.

4. The method of claim 1 further comprising resetting the fan power to a fixed fan power corresponding to a fixed fan speed when the set fan speed differs from the fixed fan speed and the vital temperature differs from the set temperature by at least a predetermined amount.

5. The method of claim 1 further comprising detecting a cooling fun maximum rotational speed and a corresponding maximum fan power such that setting the fan power is according to a percentage of the cooling fan maximum rotational speed.

6. The method of claim 1 wherein the at least a cooling fun includes a CPU cooling fan of a CPU of the computer system and an auxiliary cooling fan of the computer system, and the vital temperature is obtained from an on-die thermal monitoring transistor of the CPU.

7. The method of claim 1 wherein the cooling fan is a power supply cooling fan of a power supply of the computer system, and the vital temperature is obtained from an on-die thermal monitoring transistor of the CPU.

8. The method of claim 1 wherein the at least a cooling fan includes a CPU cooling fan of a CPU of the computer system, an auxiliary cooling fan of the computer system, and a power supply cooling fun of a power supply of the computer system, and the vital temperature is obtained from an on-die thermal monitoring transistor of the CPU.

9. The method of claim 1 wherein setting the fan power is controlled by a relation stored in a random access memory or hard disk and accessible by an operating system during an operating system execution of the computer system.

10. The method of claim 1 wherein setting the fan power is controlled by a relation stored in a BIOS memory and accessible by a BIOS of the computer system during a POST or boot of the computer system.

11. A method for controlling an operating temperature of a computer system, the method comprising:

monitoring a rotational speed of a cooling fan installed in a power supply of the computer system, the rotational speed of the cooling fan being controlled by a fan power;

monitoring a vital temperature of the computer system;

calculating a change in the vital temperature; and setting the fan power according to the calculated change in the vital temperature to control the rotational speed of the power supply cooling fan;

wherein setting the fan power further comprises:

maintaining the fan power when the vital temperature increases and the vital temperature is below a set temperature;

maintaining the fan power when the vital temperature remains constant and the vital temperature is above the set temperature; and decreasing the fan power by a third power when the vital temperature remains constant and the vital temperature is below the set temperature.

12. The method of claim 11 wherein setting the fan power further comprises:

increasing the fan power by a first power when the vital temperature increases by a first temperature, the first power being directly proportional to the first temperature.

13. The method of claim 11 wherein setting the fan power further comprises:

decreasing the fan power by a second power when the vital temperature decreases by a second temperature, the second power being directly proportional to the second temperature.

14. The method of claim 11 further comprising resetting the fan power to a fixed fan power corresponding to a fixed fan speed when the set fan speed differs from the fixed fan speed and the vital temperature differs from the set temperature by at least a predetermined amount.

15. The method of claim 11 further comprising detecting a cooling fan maximum rotational speed and a corresponding maximum fan power such that setting the fan power is according to a percentage of the cooling fan maximum rotational speed.

16. The method of claim 11 wherein the vital temperature is obtained from an on-die thermal monitoring transistor of a CPU of the computer system.

17. The method of claim 11 wherein setting the fan power is controlled by a relation stored in a random access memory or hard disk and accessible by an operating system during an operating system execution of the computer system.

18. The method of claim 11 wherein setting the fan power is controlled by a relation stored in a BIOS memory and accessible by a BIOS of the computer system during a POST or boot of the computer system.

19. A method for controlling an operating temperature of a computer system, the method comprising:

monitoring a rotational speed of at least a cooling fan of the computer system, the rotational speed of the cooling fan being controlled by a fan power;

monitoring a vital temperature of the computer system; and setting the fan power based on a change in the vital temperature; wherein when the change in the vital temperature is negative, the fan power is reduced to reduce the fan rotational speed; and when the change in the vital temperature is positive, the fan power is increased to increase the fan rotational speed;

wherein setting the fan power further comprises:

maintaining the fan power when the vital temperature increases and the vital temperature is below a set temperature;

maintaining the fan power when the vital temperature remains constant and the vital temperature is above the set temperature; and decreasing the fan power by a third power when the vital temperature remains constant and the vital temperature is below the set temperature.

20. The method of claim 19 further comprising resetting the fan power to a fixed fan power corresponding to a fixed fan speed when the set fan speed differs from the fixed fan speed and the vital temperature differs from the set temperature by at least a predetermined amount.

21. A method for controlling an operating temperature of a computer system, the method comprising:

monitoring a rotational speed of a cooling fan installed in a power supply of the computer system, the rotational speed of the cooling fan being controlled by a fan power;

monitoring a vital temperature of the computer system; and setting the fan power according to the vital temperature to control the rotational speed of the power supply cooling fan;

wherein setting the fan power further comprises:

maintaining the fan power when the vital temperature increases and the vital temperature is below a set temperature;

maintaining the fan power when the vital temperature remains constant and the vital temperature is above the set temperature; and decreasing the fan power by a third power when the vital temperature remains constant and the vital temperature is below the set temperature.

22. The method of claim 21 further comprising resetting the fan power to a fixed fan power corresponding to a fixed fan speed when the set fan speed differs from the fixed fan speed and the vital temperature differs from the set temperature by at least a predetermined amount.

* * * * *